(12) United States Patent
Hocking et al.

(10) Patent No.: US 10,843,921 B2
(45) Date of Patent: Nov. 24, 2020

(54) ELECTRICAL CONNECTION TO A MICRO ELECTRO-MECHANICAL SYSTEM

(71) Applicant: Kionix, Inc., Ithaca, NY (US)

(72) Inventors: Andrew Hocking, Ithaca, NY (US); Sangtae Park, Ithaca, NY (US); Scott Miller, Ithaca, NY (US)

(73) Assignee: KIONIX, INC., Ithaca, NY (US)

( * ) Notice: Subject to any disclaimer, the term of this patent is extended or adjusted under 35 U.S.C. 154(b) by 0 days.

(21) Appl. No.: 16/243,671

(22) Filed: Jan. 9, 2019

(65) Prior Publication Data

US 2020/0216310 A1    Jul. 9, 2020

(51) Int. Cl.
  *B81C 1/00*  (2006.01)
  *H01L 21/768*  (2006.01)
  *B81B 7/00*  (2006.01)

(52) U.S. Cl.
  CPC ........ *B81C 1/00246* (2013.01); *B81B 7/0032* (2013.01); *B81C 1/00095* (2013.01); *B81C 1/00261* (2013.01); *H01L 21/76898* (2013.01); *B81B 2201/0235* (2013.01); *B81B 2201/0242* (2013.01); *B81C 2201/013* (2013.01)

(58) Field of Classification Search
  CPC ........... B81C 1/00246; B81C 1/00095; B81C 1/00261; B81C 2201/013; H01L 21/76898; B81B 7/0032; B81B 2201/0242; B81B 2201/0235
  See application file for complete search history.

(56) References Cited

U.S. PATENT DOCUMENTS

| | | | |
|---|---|---|---|
| 9,702,699 B2 * | 7/2017 | Furuhata | G01C 19/5733 |
| 2001/0015101 A1 * | 8/2001 | Iwaki | G01C 19/5719 |
| | | | 73/504.02 |
| 2006/0179942 A1 * | 8/2006 | Fukaura | B81B 7/007 |
| | | | 73/514.16 |
| 2016/0238390 A1 * | 8/2016 | Yu | G01C 19/5747 |
| 2018/0074090 A1 * | 3/2018 | Boysel | G01L 19/0076 |
| 2018/0259335 A1 * | 9/2018 | Giner | G01C 19/5762 |

* cited by examiner

*Primary Examiner* — Yasser A Abdelaziez
(74) *Attorney, Agent, or Firm* — Alston & Bird LLP (57) ABSTRACT

A MEMS device includes, in part, first and second conductive semiconductor substrates, an insulating material disposed between the semiconductor substrates, a cavity formed in the second semiconductor substrate, and at least first and second drive masses each of which includes a multitude of beams etched from the first semiconductor substrate and is adapted to move in the cavity in response to an applied force. At least a first portion of the first substrate is adapted to move in response to the applied force and causes the at least first and second drive mass to be in electrical communication with the first substrate. The device may further include, in part, a coupling spring disposed between and in electrical communication with the first and second drive masses. The coupling spring is adapted to provide electrical communication between a second portion of the first substrate and the first and second drive masses.

7 Claims, 7 Drawing Sheets

ELECTRICAL CONNECTION TO A MICRO ELECTRO-MECHANICAL SYSTEM

FIELD OF THE INVENTION

The present invention relates to Micro Electro-Mechanical Systems (MEMS), and more particularly to electrical connectivity in MEMS.

BACKGROUND

MEMS, such as motion sensors, inertial sensors, and movable mirrors, are being widely used. As is well known, a MEMS motion sensor may be, for example, an accelerometer for detecting linear motion, or a gyroscope for detecting rotation and angular velocities. Advanced planar silicon manufacturing processes have become the main manufacturing techniques in MEMS. However, a need continues to exist for improvement in manufacturing MEMS devices.

BRIEF SUMMARY OF THE INVENTION

A MEMS device, in accordance with one embodiment of the present invention, includes, in part, a first conductive semiconductor substrate, a second conductive semiconductor substrate, an insulating material disposed between the first and second conductive semiconductor substrates, a cavity formed in the second conductive semiconductor substrate, and at least first and second drive masses each of which includes a multitude of beams etched from the first conductive semiconductor substrate and adapted to move in the cavity and in response to an applied force. At least a first portion of the first conductive semiconductor substrate is adapted to move in response to the applied force and causes the at least first and second drive mass to be in electrical communication with the first conductive semiconductor substrate.

In one embodiment, the MEMS further includes, in part, at least one coupling spring disposed between and in electrical communication with the first and second drive masses. The coupling spring is adapted to provide electrical communication between a second portion of the first conductive substrate and the first and second drive masses. The second portion of the first conductive semiconductor substrate is adapted not to move in response to the applied force In one embodiment, the first and second semiconductor substrates are silicon substrates and the first insulating layer is a silicon oxide layer. In one embodiment, the MEMS device further includes, in part, an isolation joint formed in the first conductive semiconductor substrate.

In one embodiment, the MEMS device further includes, in part at least one spring isolated from at least a portion of each of the first and second drive masses by the isolation joint. In one embodiment, each beam is a silicon beam. In one embodiment, the MEMS device further includes, in part, a metal layer formed on a surface of the first semiconductor substrate, and a wirebond that is in electrical communication with the second portion of the first semi-conductor substrate via the metal layer.

DETAILED DESCRIPTION OF THE INVENTION

Figure 1:
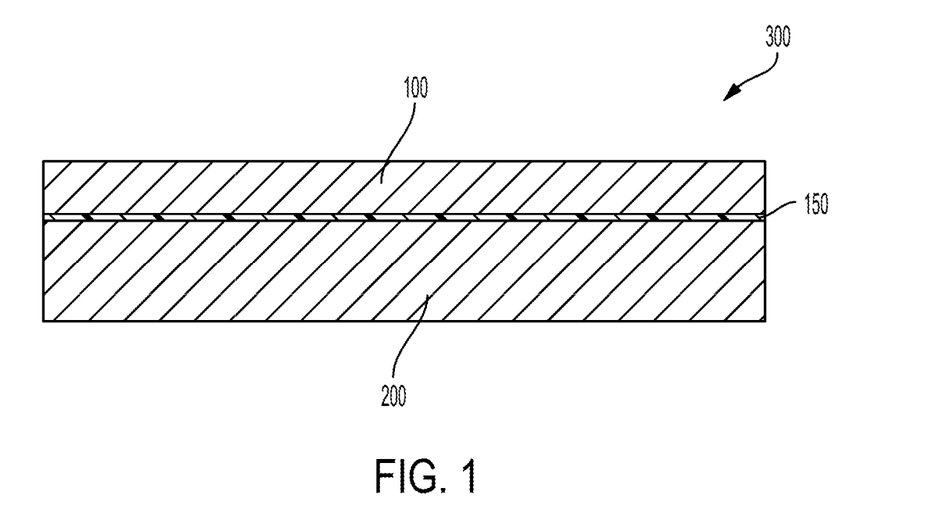
FIG. 1 is a cross-sectional view of a silicon-on-insulator wafer (substrate) in which a MEMS device is formed, in accordance with one exemplary embodiment of the present invention.

In accordance with one embodiment of the present invention, a MEMS device includes, in part, an electrical connection to the drive masses that is externally driven. FIG. 1 is a cross-sectional view of a silicon device layer (also referred to herein alternatively as wafer) 100 and a silicon handle wafer 200 with a buried oxide layer 150 disposed therebetween. Device layer 100, handle wafer 200 and the buried oxide layer 150 collectively form a silicon-on-insulator (SOI) substrate or wafer.

Figure 2:
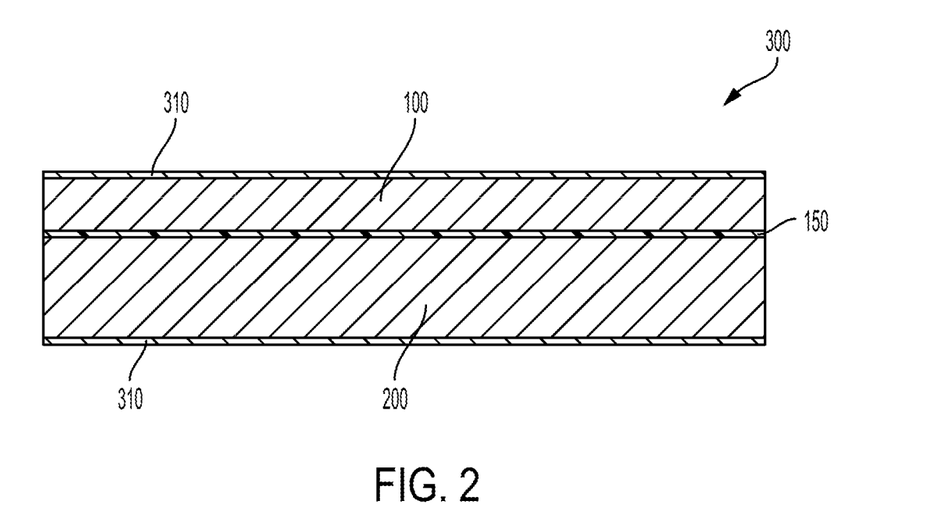
FIG. 2 is a cross-sectional view of the substrate of FIG. 1 following a thermal oxidation process, in accordance with one exemplary embodiment of the present invention.
Figure 3:
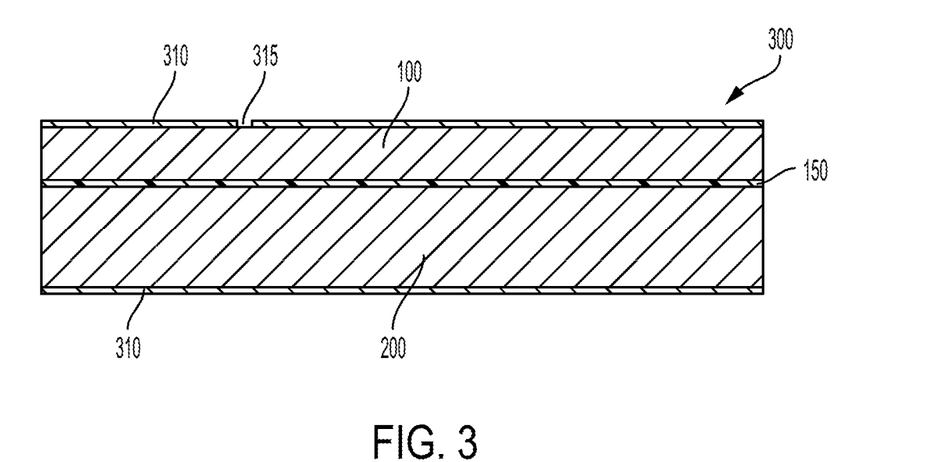
FIG. 3 is a cross-sectional view of the substrate of FIG. 2 following the formation of an opening in the oxide, in accordance with one exemplary embodiment of the present invention.

To form a MEMS, in accordance with one embodiment of the present invention, as shown in FIG. 2, during a thermal oxidation process, a layer 310 of thermal oxide is grown on the top and back sides of the SOI wafer. Next, using a patterning and reactive ion etching (RIE) steps, an opening 315 is formed in oxide layer 310, as shown in FIG. 3.

Figure 4:
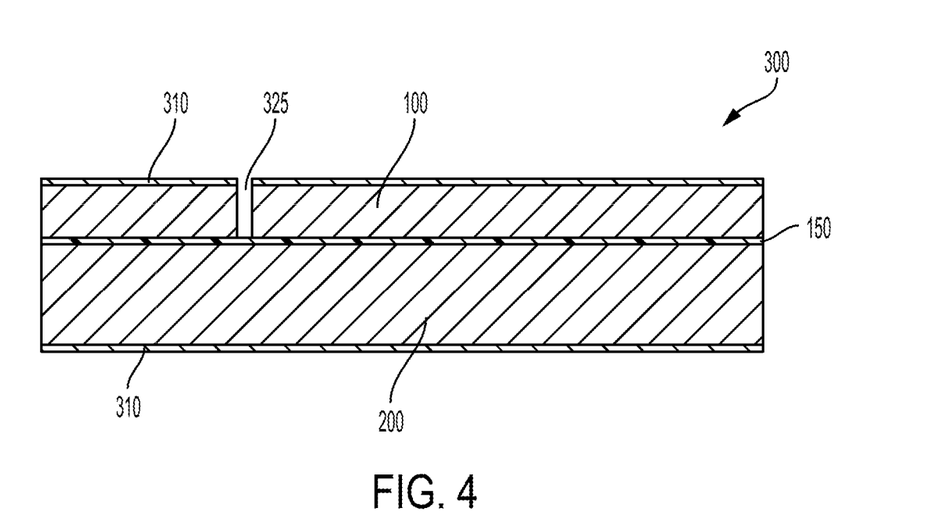
FIG. 4 is a cross-sectional view of the substrate of FIG. 3 following the formation of a trench, in accordance with one exemplary embodiment of the present invention.
Figure 5:
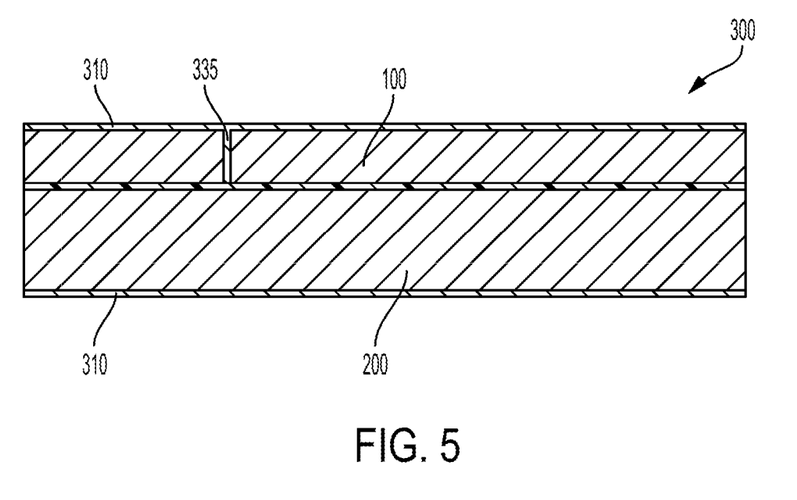
FIG. 5 is a cross-sectional view of the substrate of FIG. 4 following the filling of the trench, in accordance with one exemplary embodiment of the present invention.

Thereafter, using a DRIE process, a trench 325 is formed in device layer 100 at opening 315 which extends to and stops on oxide layer 150, as shown in FIG. 4. Trench 325 is then filled with oxide to form isolation joint 335, as shown in FIG. 5. Subsequently, oxide layer 310 is planarized. In one embodiment, the thickness of oxide layer 310 following the planarization step is about 1 µm. Although the Figures are shown as including one such isolation joint 335, it is understood that other embodiments may include more than one isolation joint.

Figure 6:
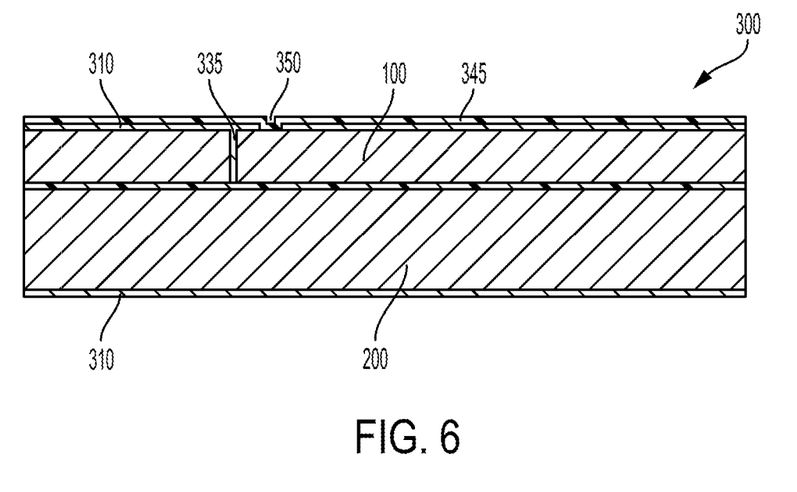
FIG. 6 is a cross-sectional view of the substrate of FIG. 5 following the formation of an opening in the oxide and deposition of a layer of screen oxide, in accordance with one exemplary embodiment of the present invention.

Next, a contact opening 350 is formed in oxide layer 310 of device layer 100 (using, for example, fluorine based RIE) and a relatively thin layer of screen oxide 345 is grown on the resulting structure, as shown in FIG. 6. The thickness of screen oxide layer 345 is often less than the thickness of oxide layer 310. For example, in one embodiment, when oxide layer 310 has a thickness of 1.1 µm, screen oxide layer 345 may have a thickness of 25 nm. It is understood that the various layers and structures shown in the Figures are not drawn to scale. Thereafter, a dopant, such as Boron ions, are implanted through screen oxide layer 345, thereby ensuring electrical contact between the first metal layer and the region near the top surface of the device layer 100

Figure 7:
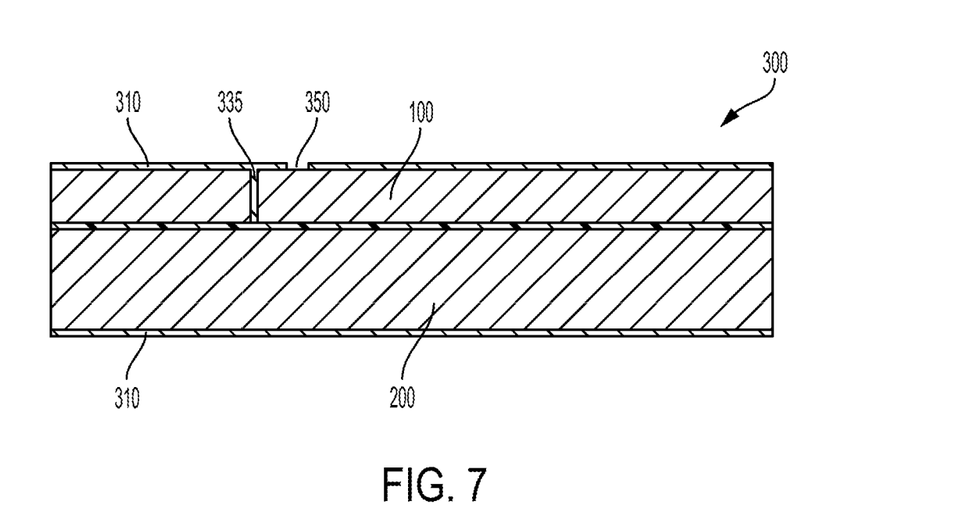
FIG. 7 is a cross-sectional view of the substrate of FIG. 6 following a dopant implantation step and removal of the screen oxide, in accordance with one exemplary embodiment of the present invention.
Figure 8:
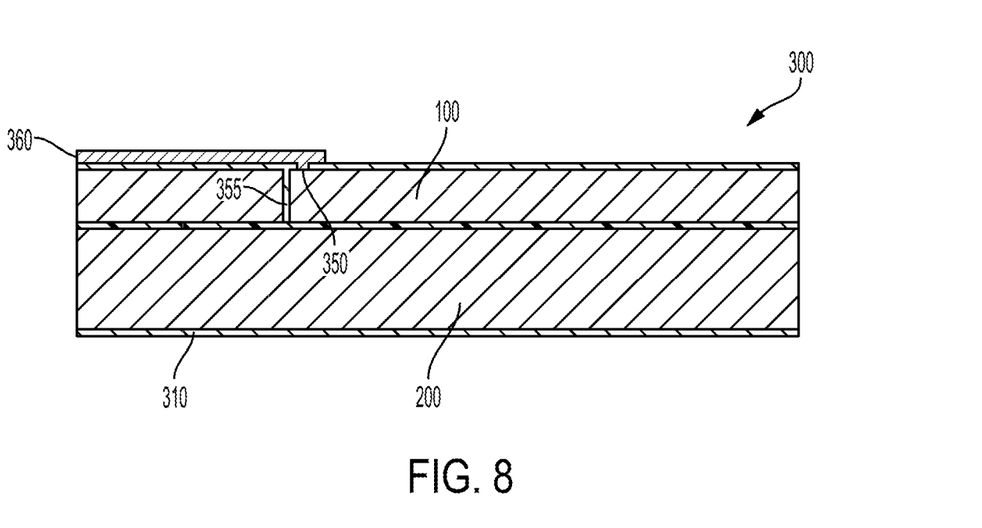
FIG. 8 is a cross-sectional view of the substrate of FIG. 7 following the deposition and patterning of a first metal layer, in accordance with one exemplary embodiment of the present invention.

Next, a sacrificial oxide etching step is performed using, for example, buffered oxide etching step (BOE), thereby removing oxide layer 345, as shown in FIG. 7. Thereafter, a layer of metal, such as Aluminum, is deposited, using for example physical vapor deposition (PVD), and patterned so as to form metal trace 360 which also forms a contact with the Boron-doped silicon 100 positioned below opening 350, as shown in FIG. 8. In one embodiment, metal trace 360 has a thickness ranging from 0.1 um to 0.5 um.

Figure 9:
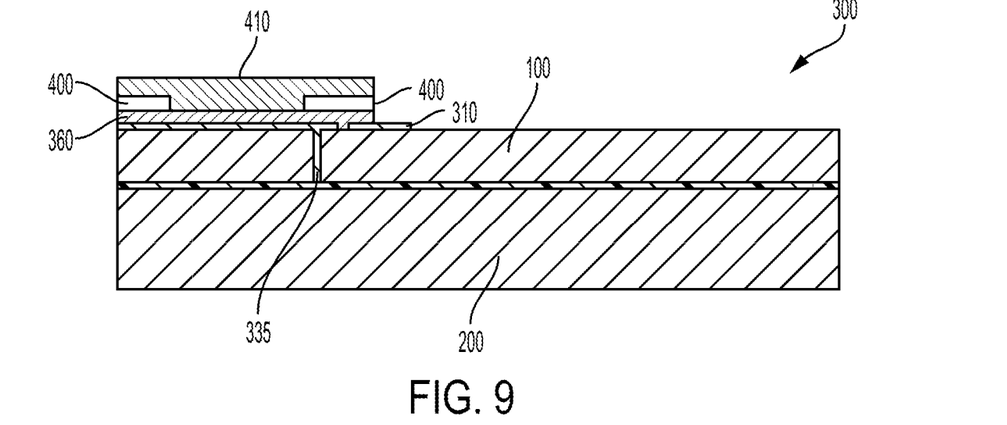
FIG. 9 is a cross-sectional view of the substrate of FIG. 8 following a number of deposition and patterning steps, in accordance with one exemplary embodiment of the present invention.

To form a second metal layer, a second layer of passivation 400, such as TEOS oxide, is deposited on the device structure shown in FIG. 8 and subsequently patterned. In one embodiment, such a passivation layer may have a thickness of 1.0 µm. Thereafter, a second layer of metal 410 is deposited and patterned, using for example, spray etching. In one embodiment, Aluminum is used as a second layer metal having a thickness of, e.g., 0.7 µm. FIG. 9 shows the resulting device structure after the patterning of the second metal layer. As shown in FIG. 9, a portion of second metal layer 410 is seen as forming an electrical contact with a portion of first metal layer 360.

Figure 10:
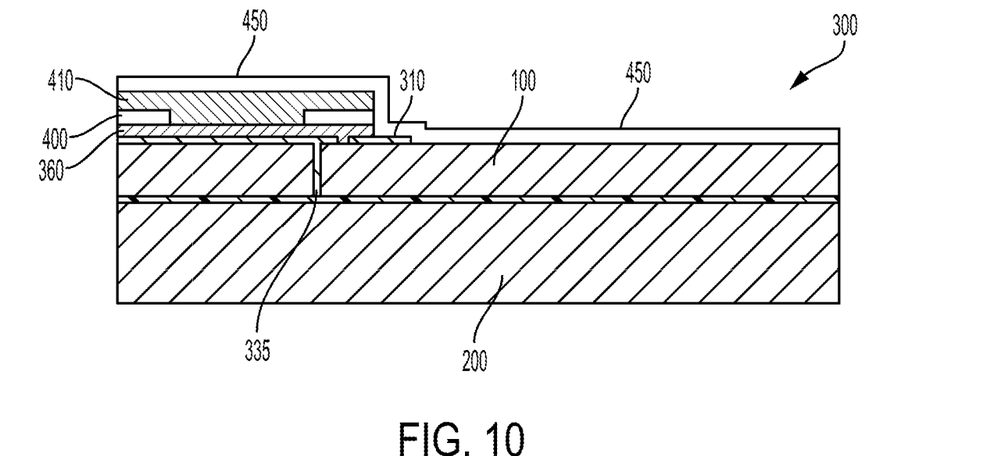
FIG. 10 is a cross-sectional view of the substrate of FIG. 9 following the deposition of a second passivation layer, in accordance with one exemplary embodiment of the present invention.

Next, as shown in FIG. 10, another passivation layer 450, such as TEOS oxide, that may have a thickness of e.g. 0.2 µm, is deposited over the device structure of FIG. 9. A sintering bake process in the temperature range from 375 C to 450 C may be used to enhance electrical connection between the first layer of metal and the top silicon surface in the contact opening area. As is well known, a rapid thermal anneal process (RTA) may also be used to achieve the same effect in forming the metal-silicon contact. Although not shown, additional layers of metal (such as third and fourth metal layer) may be deposited, patterned and passivated in a manner similar to those described above with respect to the first and second metal layers.

Figure 11:
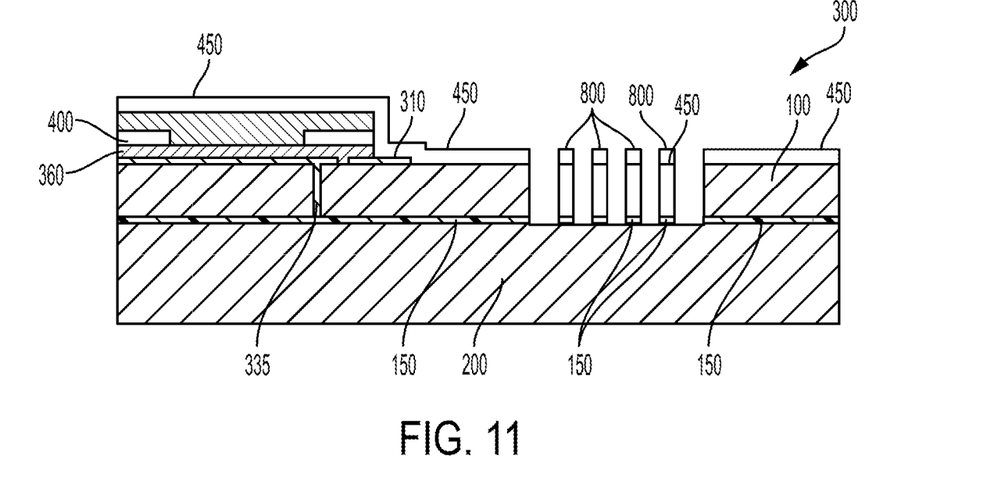
FIG. 11 is a cross-sectional view of the substrate of FIG. 10 following a number of etching steps, in accordance with one exemplary embodiment of the present invention.

Next, using a standard lithography process, a multitude of beam 800 (four of which are shown in the exemplary embodiment of FIG. 11) are formed, as described below. To form the beams, in one embodiment, a fluorine based RIE etching process is used to etch the passivation layer. Thereafter, using a DRIE etching process, any silicon exposed in device 100 wafer is etched anistropically. Next, using, for example, a fluorine based RIE etching process, any exposed silicon oxide layer 150 (also referred to herein as buried oxide layer) is also etched. Thereafter, the photoresist is also removed thereby resulting in the formation of a multitude of beams 800 each of which is shown as including a bottom layer formed from oxide 150, a middle layer formed from silicon 100, and a top layer formed from passivation layer 450, as shown in FIG. 11. Beams 800 are components of the drive masses of the MEMS.

Figure 12:
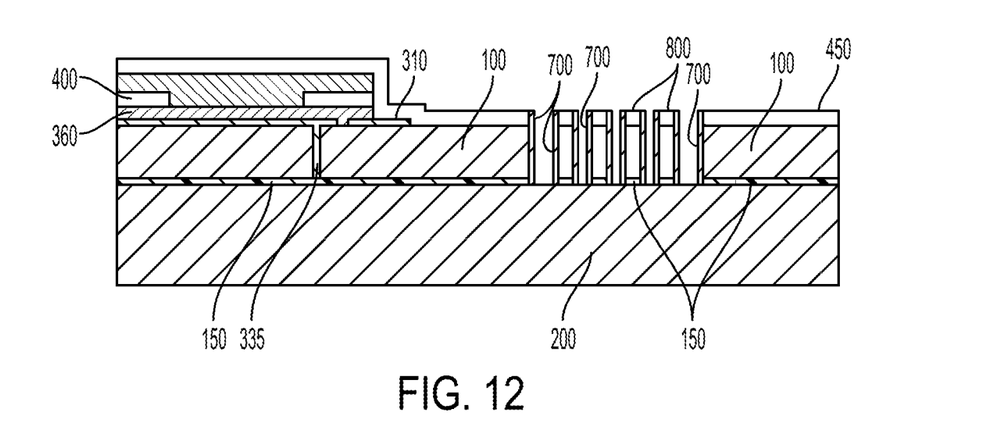
FIG. 12 is a cross-sectional view of the substrate of FIG. 11 following deposition and etching steps, in accordance with one exemplary embodiment of the present invention.
Figure 13:
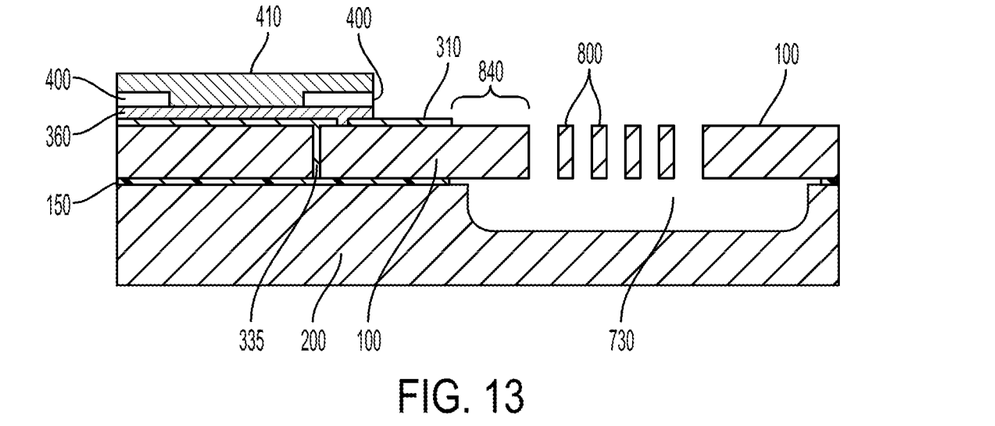
FIG. 13 is a cross-sectional view of the substrate of FIG. 12 following the formation of cavities in the substrate's handle wafer and a number of etching steps, in accordance with one exemplary embodiment of the present invention.

Next, a layer of TEOS oxide is deposited using, for example, PECVD technique, along sidewalls 700 of beams 800. The deposited TEOS oxide 700 covers any exposed silicon surfaces that have not already been covered with passivation layers. Any oxide layer covering the top surface of handle wafer 200 is subsequently removed using a fluorine based RIE step, as shown in FIG. 12. Thereafter, using a DRIE etching process, silicon is etched isotropically from handle wafer 200 to form cavity 730 as shown in FIG. 13. Cavity 730 enables the free movement of beams 800 of the MEMS drive masses in response to an applied force.

Figure 14:
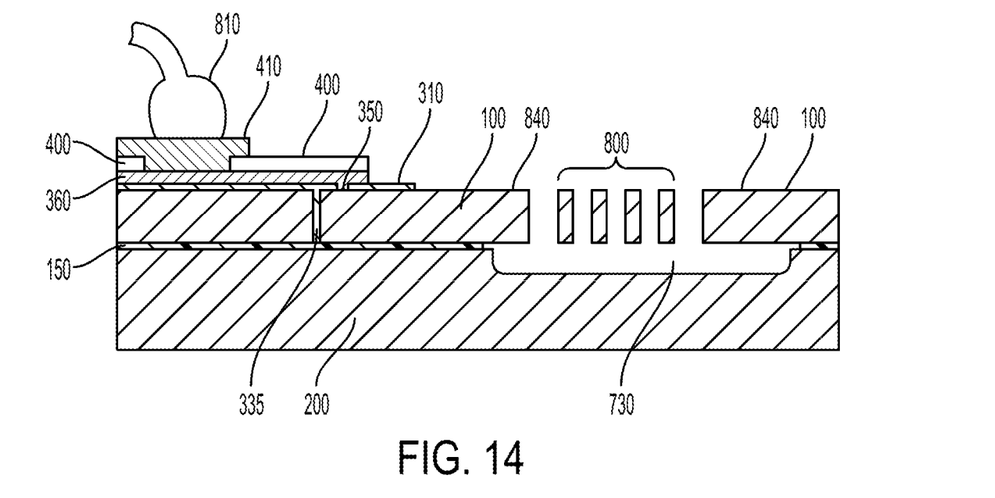
FIG. 14 is a cross-sectional view of the substrate of FIG. 13 following the formation of a wirebond, in accordance with one exemplary embodiment of the present invention.

Next, a vapor HF etch step is performed to remove any exposed oxide and passivation layers on the moving MEMS structures, thereby to from the device structure shown in FIG. 13. Each beam 800 shown in FIG. 13 thus includes only silicon. Furthermore, a portion of oxide 150 in cavity 730 is also removed. Next, a wirebond 180 is formed on metal layer 410, as shown in FIG. 14. Wirebond 810 thus provides an external connection to metal layer 410 and thus to the underlaying device layer 100 which has been implanted/doped with Boron and therefore has a relatively high conductivity.

In one embodiment, beams 800 of the drive masses form an electrical contact with metal layer 410 through the underlaying device layer 100 and out of the plane of FIG. 14. Therefore, in such embodiments, electrical connection is made between wirebond 810 and beams 800 of the drive masses via metal layer 410, metal layer 360 and region 840 of device layer 100.

Figure 15A:
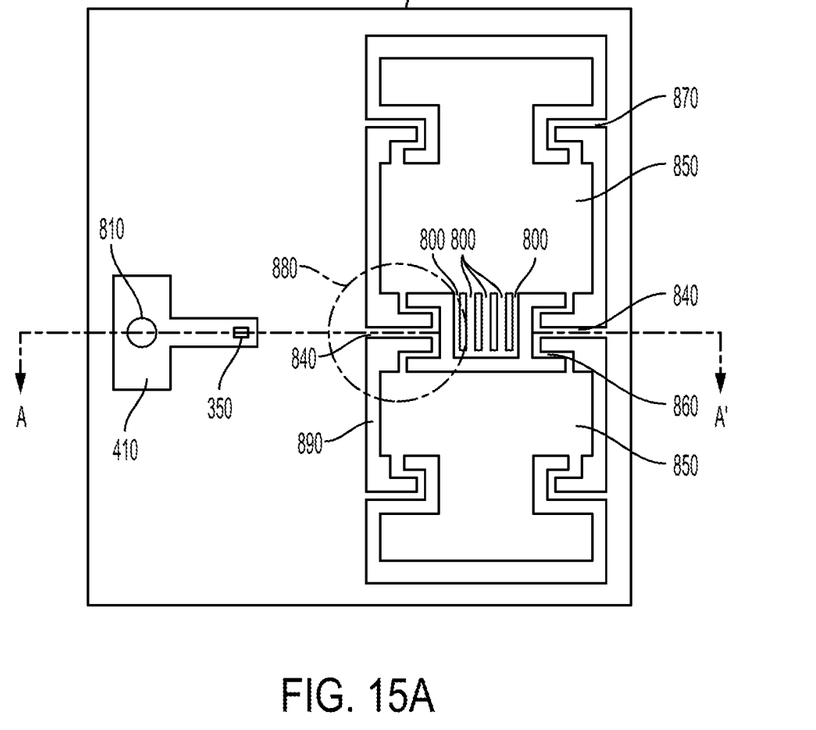
FIG. 15A is a simplified high-level top view of a MEMS device of FIG. 14, in accordance with one exemplary embodiment of the present invention.

FIG. 15A is a simplified high-level top view of a MEMS device 900, in accordance with one exemplary embodiment of the present invention. MEMS device 900 is shown as including, in part, a pair of drive masses 850 that are coupled to one another via a coupling spring 860. Each drive mass 850, which includes, in part, a multitude of beams 800 (see, for example, FIG. 14) is also shown as being coupled to springs 870. Wirebond 810 is formed on metal trace 410 that is in electrical contact with underlaying device layer 100 though metal trace 360 and via 350, as described with reference, for example, to FIG. 14. Also shown in FIG. 15A are etched regions 890 of device layer 100.

Figure 15B:
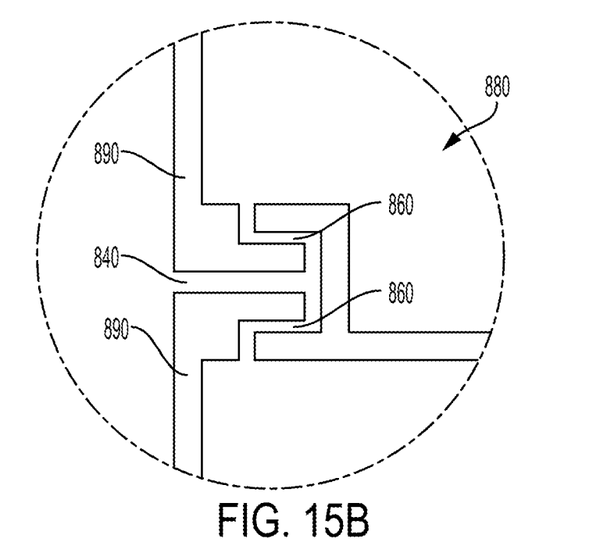
FIG. 15B is a simplified expanded view of a portion of the MEMS device of FIG. 15A, in accordance with one embodiment of the present invention.

Drive masses 850 and coupling spring 860 are both formed from device layer 100 which, as described above, is highly conductive due to the implantation process. Accordingly, drive masses 850 and coupling spring 860 are in electrical communication with one another. Drive masses 850 and coupling spring 860 are in further electrical communication with wirebond 810 through metal traces 410 and 360 via region 840 of device layer 100, as was also described above. FIG. 15B is an expanded view of region 880 of FIG. 15A showing portions of etched regions 890 and coupling spring 860 as well as region 840 of device layer 100. FIG. 14 is a cross-sectional view of MEMS device 900 when viewed along lines A-A'. It is understood that the connection between region 840 of device layer 100 and beams 800 is made out of the plane of FIG. 14. Regions 840 of device layer 100, which move in response to an applied force, are in electrical contact with first layer metal 360 through opening 350 and hence in contact with second layer metal 410 and wirebond 810.

Although not shown, in one embodiment, springs 870, which are also formed in device layer 100, are electrically isolated from portions or all of the drive masses via one or more isolation joints formed in device layer 100, such as isolation joint 335 shown in the drawings. Regions 840, which move in response to an applied force, thus electrically connect the drive masses to the non-moving portions of device layer 100. Furthermore, although FIGS. 15A and 15B are shown as including two drive masses, it is understood that a MEMS device, in accordance with embodiments of the present invention, may have any number of drive masses, such as 4.

The above embodiments of the present invention are illustrative and not limitative. Embodiments of the present invention are not limited by the type of MEMS device. Embodiments of the present invention are not limited by the type of deposition, patterning, etching, and other semiconductor processing steps required to form the various layers and structures described herein. Embodiments of the present invention are not limited to any specific thicknesses of the layers described herein. Embodiments of the present invention are not limited to the materials/layers described above. Accordingly, it is understood that other semiconductor materials may be present between the various layers described above. Other additions, subtractions or modifications are obvious in view of the present disclosure and are intended to fall within the scope of the appended claims.

What is claimed is:

1. A MEMS device comprising:
    a first electrically conductive semiconductor substrate;
    a second electrically conductive semiconductor substrate;
    an insulating material disposed between the first and second conductive semiconductor substrates;
    a cavity formed in the second conductive semiconductor substrate, said second conductive semiconductor substrate extending along a bottom of the cavity; and
    at least first and second drive masses each comprising a plurality of beams etched from the first conductive semiconductor substrate and adapted to move in the cavity and in response to an applied force, wherein at least a first portion of the first conductive semiconductor substrate is adapted to move in response to the applied force and causes the at least first and second drive mass to be in electrical communication with the first conductive semiconductor substrate.

2. The MEMS device of claim 1 further comprising:
    at least one coupling spring disposed between and in electrical communication with the at least first and second drive masses, said at least one coupling spring adapted to provide electrical communication between a second portion of the first conductive substrate and the first and second drive masses, said second portion of the first conductive semiconductor substrate adapted not to move in response to the applied force.

3. The MEMS device of claim 1 wherein said first and second semiconductor substrates are silicon substrates and the first insulating layer is a silicon oxide layer.

4. The MEMS device of claim 1 further comprising an isolation joint formed in the first conductive semiconductor substrate.

5. The MEMS device of claim 4 further comprising at least one spring isolated from at least a portion of each of the first and second drive masses by the isolation joint.

6. The MEMS device of claim 1 wherein each of the plurality of beams is a silicon beam.

7. The MEMS device of claim 1 further comprising:
    a metal layer formed on a surface of the first semiconductor substrate; and
    a wirebond in electrical communication with the second portion of the first semiconductor substrate via the metal layer.

* * * * *